United States Patent
Schmitt

(10) Patent No.: US 11,950,362 B2
(45) Date of Patent: Apr. 2, 2024

(54) METHOD FOR PRODUCING A FILM COMPOSITE, FILM COMPOSITE AND POWER ELECTRONIC SWITCHING DEVICE COMPRISING THE LATTER

(71) Applicant: SEMIKRON ELEKTRONIK GMBH & CO. KG, Nuremberg (DE)

(72) Inventor: Stefan Schmitt, Fürth (DE)

(73) Assignee: SEMIKRON ELEKTRONIK GMBH CO., KG, Nuremberg (DE)

( * ) Notice: Subject to any disclaimer, the term of this patent is extended or adjusted under 35 U.S.C. 154(b) by 0 days.

(21) Appl. No.: 18/078,931

(22) Filed: Dec. 10, 2022

(65) Prior Publication Data

US 2023/0199948 A1  Jun. 22, 2023

(30) Foreign Application Priority Data

Dec. 21, 2021 (DE) .................... 10 2021 134 004.7

(51) Int. Cl.
*H05K 1/02* (2006.01)
*H01L 23/498* (2006.01)
(Continued)

(52) U.S. Cl.
CPC .......... *H05K 1/05* (2013.01); *H01L 23/4985* (2013.01); *H05K 1/028* (2013.01); *H05K 1/118* (2013.01);
(Continued)

(58) Field of Classification Search
CPC ... H05K 1/028; H05K 2201/055; H05K 1/118
See application file for complete search history.

(56) References Cited

U.S. PATENT DOCUMENTS

| 4,425,484 A | 1/1984 | Fukukura |
| 4,484,039 A | 11/1984 | Salie |

(Continued)

FOREIGN PATENT DOCUMENTS

| DE | 102009015706 | 9/2010 | |
| DE | 102010011719 A1 | 9/2011 | |
| DE | 102012102804 B3 * | 2/2013 | ............. G02F 1/163 |

OTHER PUBLICATIONS

DE 10 2021 134 004.7, Examination Report dated Sep. 9, 2022, 8 pages—German, 6 pages—English.

*Primary Examiner* — Livius R. Cazan
(74) *Attorney, Agent, or Firm* — Andrew F. Young; NOLTE LACKENBACH SIEGEL

(57) ABSTRACT

A method for producing a film composite for electrical connection inside a power electronic switching device has the steps: A) forming a film composite having an electrically insulating insulant film with a first and a second main face. A first electrically conductive metal film, forms conductor tracks insulated from one another on the first main face, and having a second electrically conductive metal film forming conductor tracks arranged insulated from one another on the second main face of the insulant film; B) folding the film composite on a fold line, so that a first contact face of a first conductor track lies on a first contact face of a second conductor track of the first main face, and a second contact face of this first conductor track of the first main face lies on a second contact face of the second conductor track of the first main.

10 Claims, 5 Drawing Sheets

(51) Int. Cl.
*H05K 1/05* (2006.01)
*H05K 1/11* (2006.01)

(52) U.S. Cl.
CPC . *H01H 2207/008* (2013.01); *H01H 2207/026* (2013.01); *H05K 2201/055* (2013.01); *H05K 2201/10053* (2013.01); *Y10T 29/49105* (2015.01)

(56) References Cited

U.S. PATENT DOCUMENTS

| | | | |
|---|---|---|---|
| 2008/0191174 A1* | 8/2008 | Ehrensvard | H01R 4/04 252/500 |
| 2012/0043386 A1* | 2/2012 | Gotou | H05K 3/4038 29/601 |
| 2013/0230755 A1 | 9/2013 | Dimmock | |

* cited by examiner

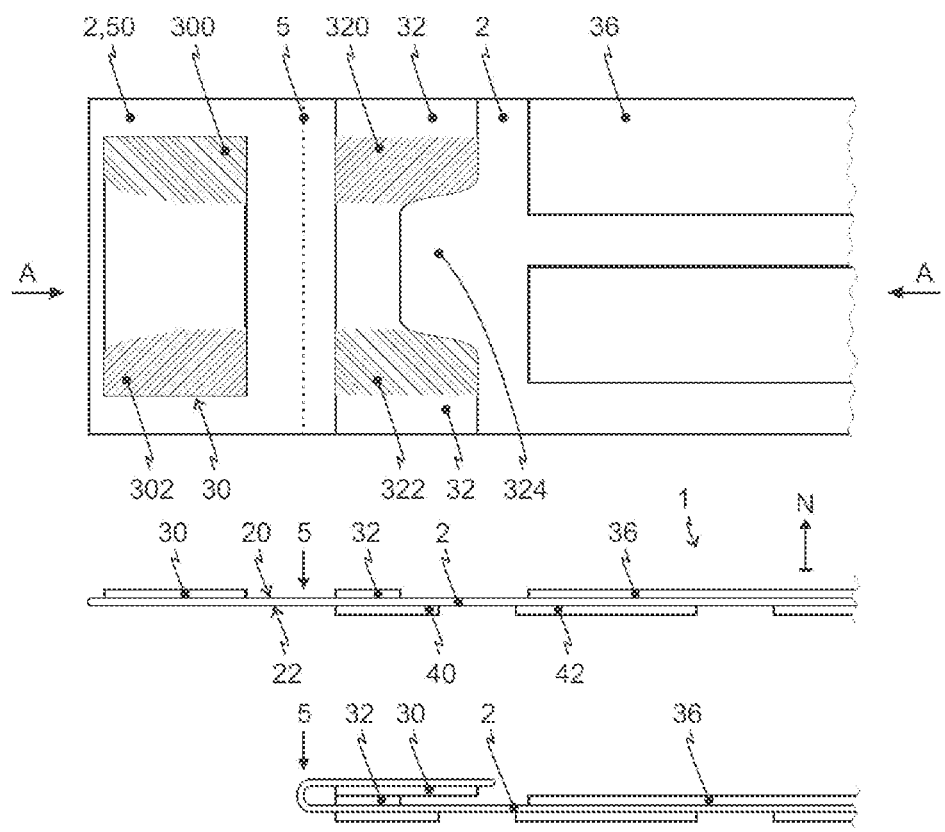
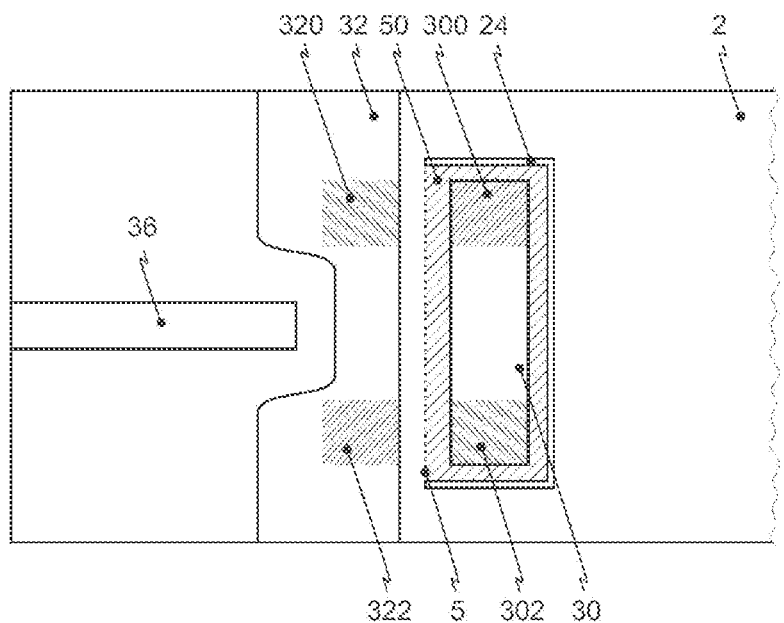

METHOD FOR PRODUCING A FILM COMPOSITE, FILM COMPOSITE AND POWER ELECTRONIC SWITCHING DEVICE COMPRISING THE LATTER

CROSS REFERENCE TO RELATED APPLICATIONS

This application relates to and claims priority to DE 10 2021 134 004.7 filed Dec. 21, 2021, the entire contents of which are incorporated herein fully by reference.

FIGURE SELECTED FOR PUBLICATION

FIG. 2.

BACKGROUND OF THE INVENTION

Field of the Invention

The invention describes a method for producing a film composite having an electrically insulating insulant film with a first and a second main face, having a first electrically conductive metal film, which is structured to form a multiplicity of conductor tracks arranged electrically insulated from one another on the first main face of the insulant film, and having a second electrically conductive metal film, which is structured to form a multiplicity of conductor tracks arranged electrically insulated from one another on the second main face of the insulant film, the film composite per se, as well as a power electronic switching device comprising the latter.

Description of the Related Art

DE 10 2010 011 719 A1 discloses as prior art a method for producing an electrically conductive connection of a contact, which is provided on a carrier film, to a mating contact, the carrier film being recessed in a U-shape, in a way which is assigned to the contact, so that a carrier film tab having the contact is formed, which is subsequently folded about at least one fold line so that the contact comes to lie on the mating contact, after which an electrically conductive connection of the contact to the mating contact is established.

ASPECTS AND OBJECTS OF THE INVENTION

In view of the prior art, the object of the invention is to specify an alternative production method for forming a film composite of the species as well as a film composite per se and a power electronic switching device comprising the latter, in each case with enhanced flexibility of the connection topology of the film composite.

This object is achieved according to the invention by a method for producing a film composite for electrical connection inside a power electronic switching device, having the following method steps:

A) forming a film composite having an electrically insulating insulant film with a first and a second main face, having a first electrically conductive metal film, which is structured to form a multiplicity of conductor tracks arranged electrically insulated from one another on the first main face of the insulant film, and having a second electrically conductive metal film, which is structured to form a multiplicity of conductor tracks arranged electrically insulated from one another on the second main face of the insulant film;

B) folding the film composite along a fold line, so that a first contact face of a first conductor track, arranged on a fold section of the film composite, of the first main face comes to lie on a first contact face of a second conductor track of the first main face, and a second contact face of this first conductor track of the first main face comes to lie on a second contact face of the second conductor track of the first main face or on a first contact face of a third conductor track of the first main face.

In this case, it may be advantageous that, after method step A), the insulant film is recessed, preferably in a U-shape, in such a way that the first conductor track of the first main face is arranged inside a fold section, formed in this way, of the film composite, and the fold line delimits this fold section. In the case of a U-shaped recess, the fold line is then adjacent to the "U" on the open side.

It may be advantageous that, after method step B), the first contact face of the first conductor track of the first main face is connected to the first contact face of the second conductor track of the first main face, and the second contact face of the first conductor track is connected to the second contact face of the second conductor track or to the first contact face of the third conductor track of the first main face, in a materially-bonded manner, in particular by means of laser welding from the direction of the second main face. In this case, the insulant film may comprise a gap in the region of the material bond.

The object is also achieved by a film composite produced by the method mentioned above, wherein the first conductor track of the first main face is in exclusive electrical contact with the second or the second and third conductor track of the first main face.

In this case, it may be advantageous that no further conductor track is arranged on the second main face of the insulant film in the region of the fold section.

It may furthermore be advantageous that the first contact face of the first conductor track and the second contact face of the first conductor track form a continuous overall face.

It may also be preferred that the first contact face of the second conductor track and the second contact face of the second conductor track form a common overall face.

The object is furthermore achieved by a power electronic switching device having a film composite produced or configured according to one of the preceding claims for internal electrical connection of this switching device, and having a pressing device, the pressing device comprising a first pressing element, which exerts pressure on the fold section from the direction of its second main face and in the direction towards a substrate of the switching device onto the connection between the first and second contact face.

In this case, it is advantageous that a force-fit electrically conductive contact between the first contact face of the first conductor track and the first contact face of the second conductor track is formed by this pressure exertion.

It may also be preferred that, by means of this first pressing element, in the same way and additionally, pressure is exerted onto the connection between the second contact face of the first conductor track and the second contact face of the second conductor track or first contact face of the third conductor track.

As an alternative thereto, it may be preferred that, by means of a second pressing element, in the same way as by the first pressing element, pressure is exerted onto the connection between the second contact face of the first conductor track and the second contact face of the second conductor track or first contact face of the third conductor track. In this case, it may also be preferred that a force-fit electrically conductive contact between the second contact face of the first conductor track and the second contact face of the second conductor track or the first contact face of the third conductor track is formed by this pressure exertion.

Of course, unless it is ruled out explicitly or per se or conflicts with the concept of the invention, the features respectively mentioned in the singular may also be present in the plural in the film composite according to the invention as well as in the power electronic switching device according to the invention.

It is to be understood that the various configurations of the invention, regardless of whether they are mentioned in the context of the production method or the description of the film composite or the power electronic switching device, may be implemented individually or in any desired combinations in order to achieve improvements. In particular, the features mentioned and explained above and below may be used not only in the combinations specified but also in other combinations or separately, without departing from the scope of the present invention.

Further explanations of the invention, advantageous details and features may be found in the following description of the exemplary embodiments of the invention, which are schematically represented in FIGS. 1 to 6, or respective parts thereof.

The above and other aspects, features, objects, and advantages of the present invention will become apparent from the following description read in conjunction with the accompanying drawings, in which like reference numerals designate the same elements.

BRIEF DESCRIPTION OF THE DRAWINGS

FIG. 1 shows various method steps of the production of a first film composite according to the invention in various views.

FIGS. 2 and 3 show various method steps of the production of two configurations of a second film composite according to the invention in various views.

DETAILED DESCRIPTION OF THE PREFERRED EMBODIMENTS

Figure 3:
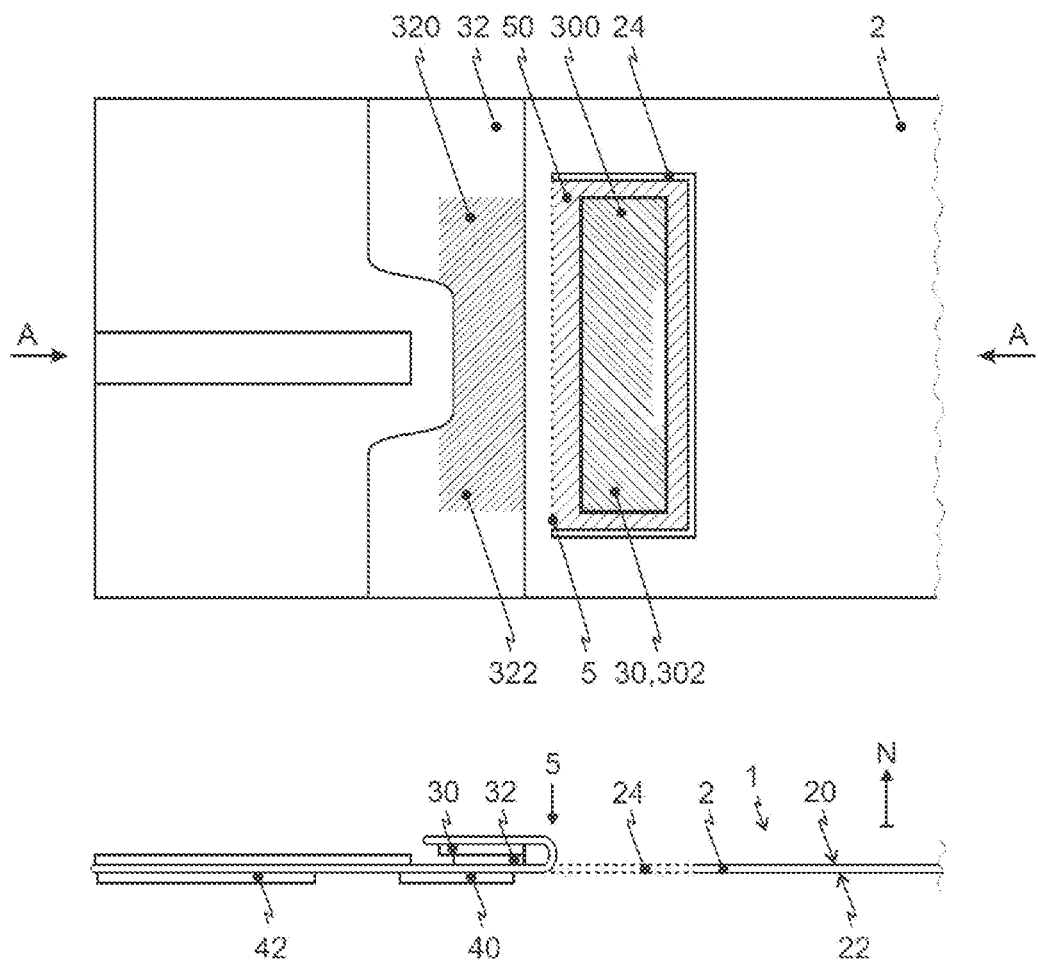

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows two method steps of the production of a first film composite 1 according to the invention in various views. In this case, an electrically insulating insulant film 2 having a thickness in the preferred range of between 0.1 mm and 0.3 mm is represented. This insulant film 2 comprises a first main face and an opposite second main face, 20, 22. A multiplicity of conductor tracks 30, 32, 36 not electrically conductively connected to one another, which have been formed by structuring a first metal film having a thickness in the preferred range of between 0.2 mm and 0.5 mm, are arranged on the first main face 20. A multiplicity of conductor tracks 40, 42 not electrically conductively connected to one another, which have been formed by structuring a second metal film essentially identical to the first, are likewise arranged on the second main face 22.

A plan view of the film composite 1 after method step A) from the normal direction N is represented in the upper region of the figure. A sectional view along the section line A A through this film composite 1 is represented in the central region of the figure. The same sectional view after method step B) is represented in the lower region of the figure.

The film composite 1, or more accurately here the insulant film 2, comprises a fold section 50, which is formed by a fold line 5 that delimits this fold section 50 from the rest of the film composite 1, or the insulant film 2. On this fold section 50, a first conductor track 30 is arranged on the first main face 20 of the insulant film 2. This first conductor track 30 of the first main face 20 is in no electrical contact with a further conductor track, either of the first or the second main face 20, 22, at the end of method step A). No further conductor track is arranged on the second main face 22 of the insulant film 2 in the region of the fold section 50.

Further conductor tracks 32, 36 are arranged on the rest of the film composite 1. A second conductor track 32 comprises here a generally required constriction region 324 in its profile, which restricts the current-carrying capacity of this second conductor track 32 because, in the event of a flow of correspondingly high currents in this constriction region 324, the heating of the second conductor track 32 by its ohmic resistance would exceed a predetermined limit.

In order to increase the current-carrying capacity over this constriction region 324, according to the invention the fold section 50 is folded along the fold line 5 in such a way that a first contact region 300 of the first conductor track 30 comes to lie on an assigned first contact region 320 of the second conductor track 32 and a second contact region 302 of the first conductor track 30 comes to lie on an assigned second contact face 322 of the second conductor track 32. In this way, an electrically conductive connection is formed between the contact faces respectively lying on one another.

The electrical current which flows through the second conductor track 32 in the longitudinal direction is therefore carried partially in the first conductor track 30. In this way, the overall cross section formed by the respective cross sections of the first and second conductor track 30, 32 is increased and the heating of the second conductor track 32 in the constriction region 324 is reduced.

By this configuration, the first conductor track 30 of the first main face 20 is in exclusive electrical contact with the second conductor track 32 of the first main face 20 at the end of method step B).

FIGS. 2 and 3 show various method steps of the production of two configurations of a second film composite 1 according to the invention in various views. An electrically insulating insulant film 2 as described for FIG. 1 is in this case respectively represented. A multiplicity of conductor tracks 30, 32, 36, not electrically connected to one another, are again arranged on the first main face 20, the second conductor track 32 of the first main face 20 again comprising a constriction region which is intended to be bridged. A multiplicity of conductor tracks 40, 42, not electrically connected to one another, are likewise arranged on the second main face 22. These conductor tracks 40, 42 are configured as described in relation to FIG. 1.

FIG. 2 shows a plan view of the film composite 1 after method step A) from the normal direction N. The film composite 1, here again the insulant film 2, comprises a fold section 50 which is formed by a fold line 5 and a U-shaped recess 24, which in the simplest case is formed by a U-shaped cut around and at a slight distance from the first conductor track 30 of the first main face 20. The insulant film 2 is therefore recessed in a U-shape, the fold line 5 delimiting the fold section 50. This fold section 50 may then be folded in a subsequent method step B) along the fold line 5 in order to form a film composite 1 according to the invention. In this case, a first contact region 300 of the first conductor track 30 then again comes to lie on an assigned first contact region 320 of the second conductor track 32 and a second contact region 302 of the first conductor track 30 comes to lie on an assigned second contact region 322 of the second conductor track 32. The constriction region of the second conductor track 32 is bridged by the electrically conductive connection between the contact faces respectively lying on one another.

A plan view of the film composite 1 after method step A) from the normal direction N is represented in the upper region of FIG. 3. A sectional view along the section line A A through this film composite 1 after method step B) is represented in the lower region of FIG. 3.

In contrast to FIG. 2, in this configuration the first contact region 300 of the first conductor track 30 and the second contact region 302 of the first conductor track 30 form a continuous overall region. Likewise, the first contact region 320 of the second conductor track 32 and the second contact region 322 of the second conductor track 32 form a common overall region.

In both configurations mentioned, the first conductor track 30 of the first main face 20 is in exclusive electrical contact with the second conductor track 32 of the first main face 20. Again, no further conductor track is respectively arranged on the second main face 22 of the insulant film 2 in the region of the fold section 50.

Figure 4:
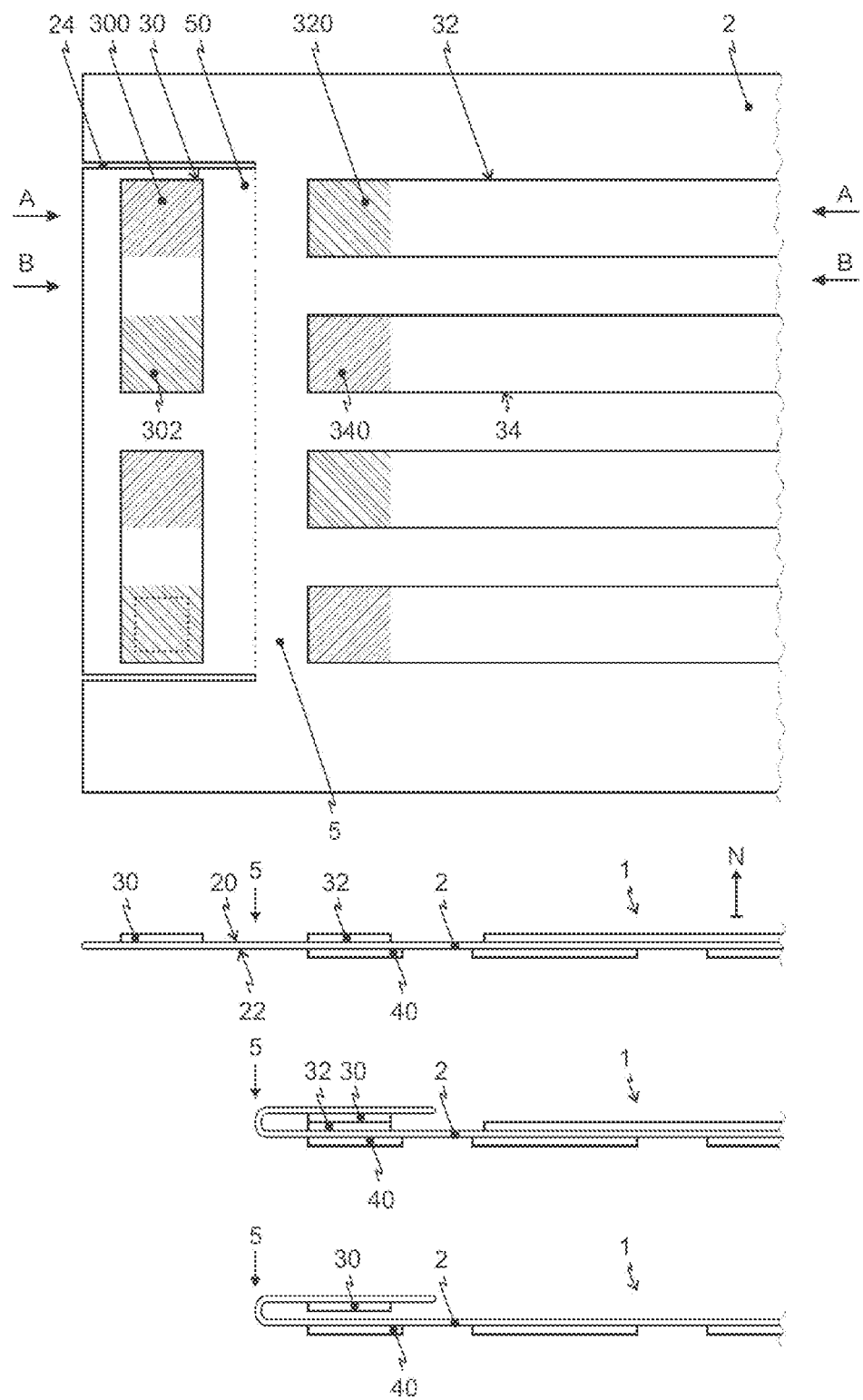
FIGS. 4 and 5 show various method steps of the production of two configurations of a third film composite according to the invention in various views.
Figure 5:
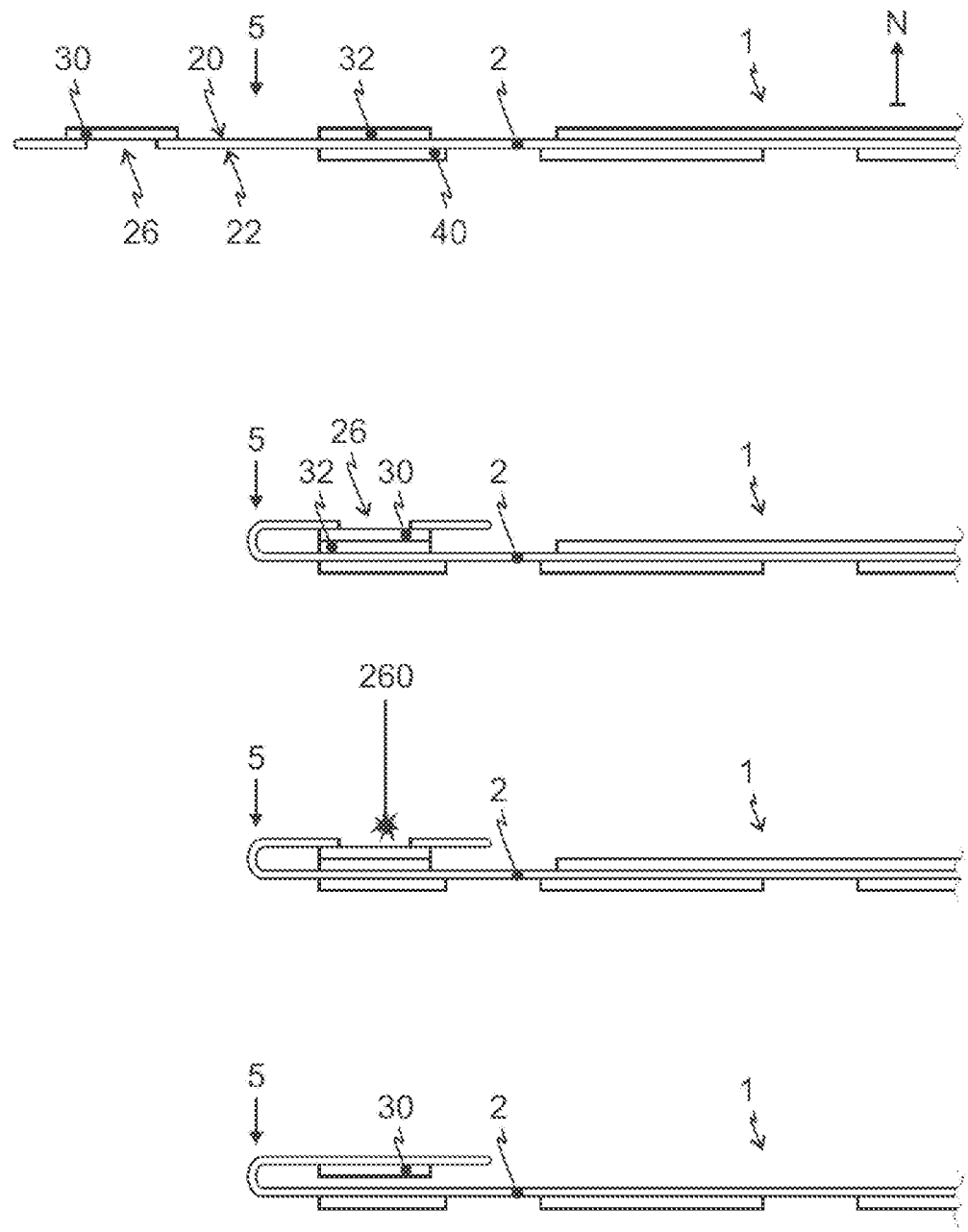

FIGS. 4 and 5 show various method steps of the production of two configurations of a third film composite 1 according to the invention in various views. A plan view of the film composite 1 after method step A) from the normal direction N is represented in the upper region of FIG. 4. A sectional view along the section line A A through this film composite 1 is represented underneath. Below this, two sectional views in each case after method step B) are represented, above along the section line A-A and underneath along the section line B-B.

The essential technical configuration of the film composite 1 is as already described above. Here, however, two first conductor tracks 30 are arranged on the first main face 20, in a fold region 50 there. This fold region 50 lies at the edge of the film composite 1. However, in this case the insulant film 2 comprises two recesses 24 which extend perpendicularly from the edge to the fold line 5 and are configured here as slits. Furthermore, two second and two third conductor tracks 32, 34 are in this case arranged on the first main face 20.

Each second and third conductor track 32, 34 respectively comprises a first contact region 320, 340. These first contact regions 320, 340 are intended to be electrically conductively connected to one another by means of the film composite 1 according to the invention after method step B). For this purpose, the fold region 50 is folded in the manner already described along the fold line 5. The first contact region 300 of the first conductor track 30 represented above therefore comes to lie on the assigned first contact region 320 of the second conductor track 32 represented above, and the second contact region 302 of the first conductor track 30 represented above comes to lie on the assigned first contact region 340 of the third conductor track 34 represented above. By the respective electrical contacts of the contact faces lying on one another, an electrically conductive connection path from the second conductor track 32 through the first conductor track 30 to the third conductor track 34 is formed by means of the first conductor track 30.

The same also applies for the conductor tracks respectively represented underneath. In both cases, the respective first conductor track 30 of the first main face 20 is in exclusive electrical contact with the assigned second and third conductor track 32, 34 of the first main face 20.

In all configurations of the film composite 1 according to the invention which have been mentioned so far, after method step B) the electrically conductive connection of assigned contact faces arranged on one another is configured in any desired way. For example, this electrically conductive connection may be configured with a force fit by means of pressure contact. Alternatively, this electrically conductive connection may be configured in a materially-bonded manner, by means of adhesive bonding, soldering or sintering.

A further variant is the welding technology connection as represented in FIG. 5. For this purpose, the insulant film 2 comprises a gap 26 extending through the insulant film 2 in the region of a section to be connected of a conductor track, here the first conductor track 30 represented.

A plan view of the film composite 1 after method step A) from the normal direction N is represented in the upper region of FIG. 5. A sectional view along the section line A A through this film composite 1 is represented underneath. Below this, two sectional views in each case after method step B) are represented, above along the section line A-A and underneath along the section line B-B.

After method step B), in this case the first contact region 300 of the first conductor track 30 of the first main face 20 is connected to the first contact region 320 of the second conductor track 32 of the first main face by means of laser welding 260 from the direction of the second main face 22. For this purpose, the laser beam impinges counter to the normal direction N of the film composite through the gap 26 onto the section of the first contact region 300 of the first conductor track 30, and connects this to the assigned section of the first contact region 320 of the second conductor track 32. In other regards, the laser welding method is configured per se as is conventional in the art.

Figure 6:
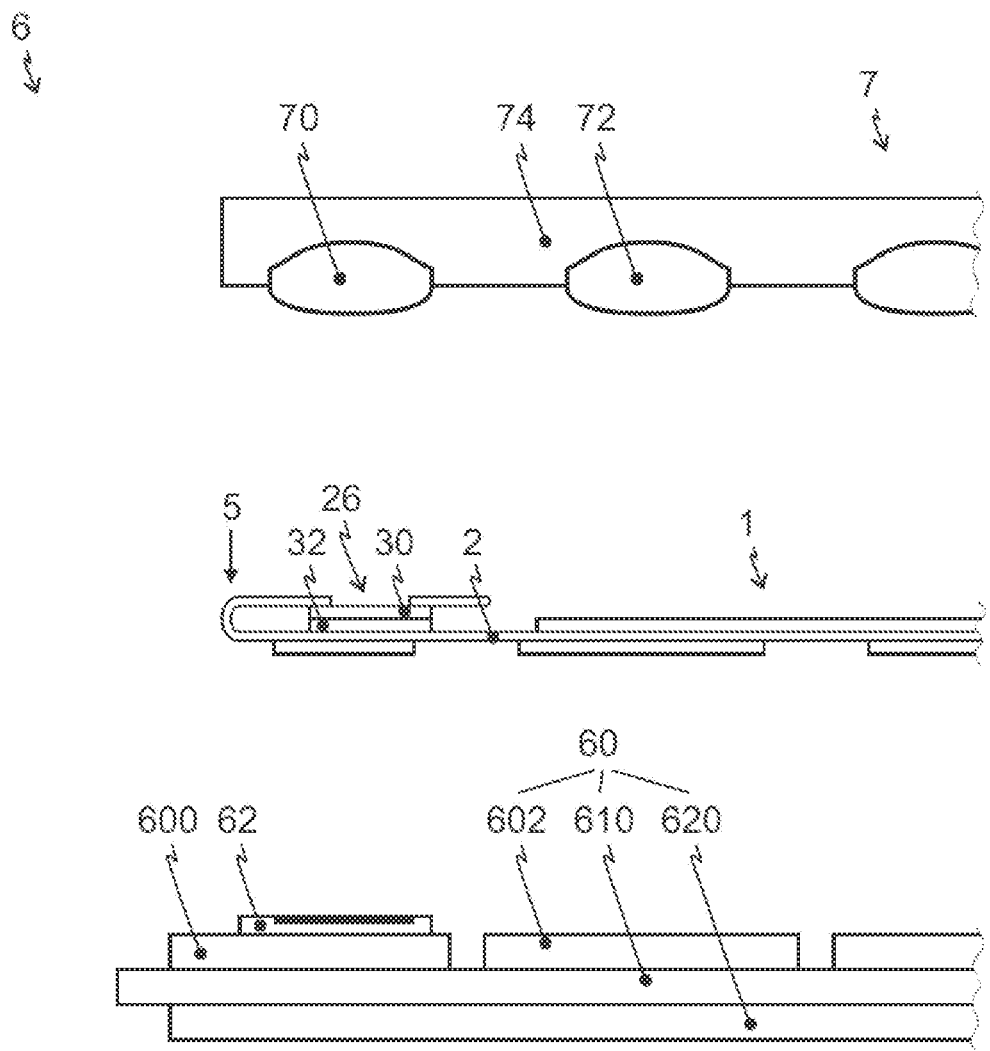
FIG. 6 shows a configuration of a power electronic switching device according to the invention in an exploded representation.

FIG. 6 shows an exploded representation of one configuration of a power electronic switching device 6 according to the invention. Represented here is a film composite 1 produced and configured according to FIG. 5 for internal electrical connection of this switching device 6. The switching device 6 furthermore comprises a pressing device 7 and a substrate 60, the pressing device 7 comprising a first pressing element 70 which presses on the fold section 50 from the direction of its second main face 22 and in the direction towards a substrate 60 of the switching device 6. In this case, this pressure could also electrically conductively establish the connection between the first and second contact regions 300, 320 by means of pressure contact. In this configuration, however, the pressing device 7, which is essentially as is conventional in the art, is used only to press the substrate 60 onto a cooling device (not represented) and for this purpose comprises further pressing elements 72 arranged in a pressing body. The substrate 60 itself is configured as is conventional in the art with an insulant body 610 and conductive faces 600, 602, 620 thereon. A power semiconductor component 62 is furthermore arranged on one of these conductive faces 600.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A method for producing a film composite (1), for electrical connection inside a power electronic switching device (6), comprising the steps of:
    A) forming a film composite (1) having an electrically insulating insulant film (2) with a first main face (20) having a first electrically conductive metal film and an opposite second main face (22) having a second electrically conductive metal film;
        wherein said first electrically conductive metal film forms a plurality of first conductor tracks (30, 32, 34, 36) respectively arranged and electrically insulated from one another on the first main face (20) of the insulant film (2);
        wherein said second electrically conductive metal film forms a plurality of second conductor tracks (40, 42) arranged electrically insulated from one another on the second main face (22) of the insulant film (2);
        at least a first designated one of said first conductor tracks (30, 32, 34, 36) is arranged on said first main face (20) of said film composite (1) in a selected location without one of said second conductor tracks (40, 42) on said opposite second main face (22) of said electrically insulating insulant film (2);
        at least one partial gap opening (26) in said selected location of said electrically insulating insulant film (2);
    B) folding the film composite (1) along a fold line (5), so that a first contact region (300) of a selected first of said first conductor tracks (30), arranged on a fold section (50) of the film composite (1), of the first main face (20) comes to lie on a first contact region (320) of a selected second of said first conductor tracks (32) of the first main face (20), and a second contact region (302) of this selected first of said first conductor tracks (30) of the first main face (20) comes to lie on a second contact region (322) of the second of said first conductor tracks (32) of the first main face (20) or on a first contact region (340) of a selected third of said first conductor tracks (34) of the first main face (20);
    wherein after method step A), the insulant film (2) is recessed in a U-shape, so that the selected first of said first conductor tracks (30) of the first main face (20) is arranged inside a fold section (50) of the film composite (1), and wherein the fold line (5) delimits this fold section (50);
        wherein said selected first of said first conductor tracks (30) is said at least first designated one of said first conductor tracks (30, 32, 34, 36) at said selected location on said electrically insulating film (2);
        wherein said selected second of said first conductor tracks (32) has at least one current-restriction region (324) which restricts a current-carrying capacity of said selected second of said first conductor tracks (32);
    wherein after method step B), the first contact region (300) of the selected first of said first conductor tracks (30) of the first main face (20) is connected to the first contact region (320) of the selected second of said first conductor tracks (32) of the first main face (20), and the second contact region (302) of the selected first of said first conductor tracks (30) is connected to the second contact region (322) of the selected second of said first conductor tracks (32) or to the first contact region (340) of the selected third of said first conductor tracks (34) of the first main face (20), in a materially-bonded manner forming a material bond by a step of laser welding (260) from the direction of the second main face (22); and
    wherein said material bond is at said selected location along said electrically insulating film (2) and in said at least one partial gap opening in said electrically insulating film (2).

2. A film composite product, produced by a method according to claim 1, wherein:
    the first of said first conductor tracks (30) of the first main face (20) is in exclusive electrical contact with at least one of the selected second of said first conductor tracks (32) and said selected third of said first conductor tracks (34) of the first main face (20).

3. The film composite product, according to claim 2, wherein:
    no further conductor track is arranged on the second main face (22) of the insulant film (2) in the region of the fold section (50).

4. The film composite product, according to claim 3, wherein:
    the first contact region (300) of the selected first of said first conductor tracks (30) and the second contact region (302) of the selected first of said first conductor tracks (30) form a continuous overall face.

5. The film composite product, according to claim 4, wherein:
    the first contact region (320) of the selected second of said first conductor tracks (32) and the second contact region (322) of the selected second of said first conductor tracks (32) form a common overall face.

6. A power electronic switching device (6) product, comprising:
    the film composite product, according to claim 2, produced by the method according to claim 1, wherein:

the film composite product (1) produced is an internal electrical connection of the switching device (6), and further comprising:
  a pressing device (7), the pressing device (7) having a first pressing element (70) that exerts a pressure on the fold section (50) from the direction of its said second main face (22) and in the direction towards a substrate (60) of the switching device (6) onto the connection between the respective said first and second contact regions (300, 320) of said selected first of said first conductor tracks (30).

7. The power electronic witching device, according to claim 6, wherein:
  a force-fit electrically conductive contact is formed by pressure exertion between the first contact region (300) of the selected first of said first conductor tracks (30) and the first contact region (320) of the selected second of said first conductor tracks (32).

8. The power electronic switching device, according to claim 7, wherein:
  said first pressing element (70) exerts pressure onto the connection between the second contact region (302) of the selected first of said first conductor tracks (30) and the second contact face of the selected second of said first conductor tracks (32) or first contact region (340) of the selected third of said first conductor tracks (34).

9. The power electronic switching device, according to claim 7, wherein:
  a second pressing element (72) exerts pressure onto the connection between the second contact region (302) of the selected first of said first conductor tracks (30) and the second contact region (322) of the selected second of said first conductor tracks (32) or first contact region (340) of the selected third of said first conductor tracks (34).

10. The power electronic switching device, according to claim 9, wherein:
  a force-fit electrically conductive contact is formed by pressure exertion between the second contact region (302) of the selected first of said first conductor tracks (30) and the second contact region (322) of the selected second of said first conductor tracks (32) or the first contact region (340) of the selected third of said first conductor tracks (34).

* * * * *